(12) United States Patent
Kon

(10) Patent No.: US 8,759,161 B2
(45) Date of Patent: Jun. 24, 2014

(54) SURFACE COATING METHOD, SEMICONDUCTOR DEVICE, AND CIRCUIT BOARD PACKAGE

(75) Inventor: Junichi Kon, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 19 days.

(21) Appl. No.: 13/347,951

(22) Filed: Jan. 11, 2012

(65) Prior Publication Data

US 2012/0184071 A1    Jul. 19, 2012

(30) Foreign Application Priority Data

Jan. 18, 2011 (JP) ................................ 2011-008239
Dec. 20, 2011 (JP) ................................ 2011-278420

(51) Int. Cl.
*H01L 21/56* (2006.01)
(52) U.S. Cl.
USPC ...... 438/127; 257/734; 257/777; 257/E21.26; 257/E21.259; 257/E21.502
(58) Field of Classification Search
USPC .......................... 438/127, 106, 703, 763, 780
See application file for complete search history.

(56) References Cited

U.S. PATENT DOCUMENTS

| 6,342,733 | B1 | 1/2002 | Hu |
| 2002/0098626 | A1* | 7/2002 | Blalock ........................ 438/127 |
| 2003/0175624 | A1 | 9/2003 | Nozaki |
| 2008/0274431 | A1 | 11/2008 | Nozaki |
| 2010/0069535 | A1* | 3/2010 | Suzuki et al. ................... 524/37 |

FOREIGN PATENT DOCUMENTS

| JP | 6-224252 | 8/1994 |
| JP | 2003-505882 A1 | 2/2003 |
| JP | 3633595 | 1/2005 |
| TW | 200906929 | 2/2009 |

OTHER PUBLICATIONS

Taiwanese Office Action issued for Taiwan Patent Application No. 101101712 dated Oct. 7, 2013.

* cited by examiner

*Primary Examiner* — Chuong A Luu
*Assistant Examiner* — Rodolfo Fortich
(74) *Attorney, Agent, or Firm* — Kratz, Quintos & Hanson, LLP

(57) ABSTRACT

To provide a surface coating method, which contains applying a surface coating material to a layered structure so as to cover at least a surface of an insulating film of the layered structure, to form a coating on the surface of the insulating film, wherein the surface coating material contains a water-soluble resin, an organic solvent, and water, and wherein the layered structure contains the insulating film exposed to an outer surface, and a patterned metal wiring exposed to an outer surface.

14 Claims, 9 Drawing Sheets

SURFACE COATING METHOD, SEMICONDUCTOR DEVICE, AND CIRCUIT BOARD PACKAGE

CROSS-REFERENCE TO RELATED APPLICATIONS

This application is based upon and claims the benefit of priority of the prior Japanese Patent Application No. 2011-008239, filed on Jan. 18, 2011, and Japanese Patent Application No. 2011-278420, filed on Dec. 20, 2011, the entire contents of which are incorporated herein by reference.

FIELD

The embodiments discussed herein relate to a surface coating method, a semiconductor device, and a circuit board package.

BACKGROUND

In semiconductor devices, or circuit board packages, atoms (specially Cu) forming a wiring are ionized during an operation, and these ionized atoms move into an insulating film by electric field, or move cross an interface with another material around the wiring, which cause a problem in significantly reducing service life of the wiring.

As for a method for preventing the movement of the atoms, there are a method for covering a surface of a wiring with a metal having higher resistance than that of the wiring material, and a method for forming a barrier layer on the wiring. Examples of the method for forming a barrier layer on the wiring include a method in which a barrier layer is formed on an insulating film, and a wiring is formed on the barrier layer, and a method in which a barrier layer is formed on a surface of a wiring after forming the wiring (see, for example, Japanese Patent Application Laid-Open (JP-A) No. 2003-505882). In accordance with the latter method, a barrier layer is often formed by electroless plating. If any conductive impurity is present on an insulating film other than on the wiring, the plating grows abnormally using the impurity as a nucleus, which causes failures such as short circuit, and reduction in reliability.

To solve this problem, conductive impurities on an insulating film are conventionally removed by washing using strong acid or strong base before plating.

This method, however, has problems that a wiring and an insulating film are damaged, or a production process becomes complicated.

In a production method of a semiconductor device, as a method for forming a fine pattern, there is proposed a method contains a step for applying a water-soluble composition so as to over a surface of a resist pattern to thereby swell the resist pattern, and a step for patterning an underlying layer by performing dry etching using the swollen resist pattern as a mask (see, for example, Japanese Patent (JP-B) No. 3633595).

In this proposed method, however, the aforementioned problems that failures such as short circuit and reduction in reliability occur due to the presence of conductive impurities on an insulating film other than a wiring are not discussed.

Accordingly, it is currently desired to provide a surface coating method capable of capable of preventing abnormal growth on an insulating film due to conductive impurities without damaging wirings and the insulating film, and to provide a semiconductor device and a circuit board package produced using the method.

SUMMARY

The disclosed surface coating method contains applying a surface coating material to a layered structure so as to cover at least a surface of an insulating film of the layered structure, to form a coating on the surface of the insulating film, in which the surface coating material contains a water-soluble resin, an organic solvent, and water, and in which the layered structure contains the insulating film exposed to an outer surface, and a patterned metal wiring exposed to an outer surface.

The disclosed semiconductor device contains: a layered structure containing an insulating film and a patterned metal wiring; a coating formed by the disclosed surface coating method on a surface of the insulating film; and a plating layer formed on a surface of the metal wiring.

The disclosed circuit board package contains: a layered structure containing an insulating film and a patterned metal wiring; a coating formed by the disclosed surface coating method on a surface of the insulating film; and a plating layer formed on a surface of the metal wiring.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Surface Coating Method

Figure 1A:
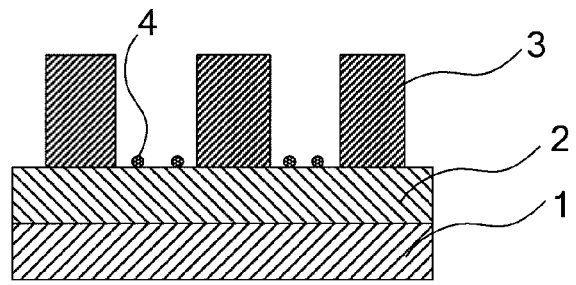
FIG. 1A is a schematic cross-sectional diagram illustrating the state where an insulating film and a metal wiring are formed on a base.

The disclosed surface coating method is a method containing applying a surface coating material to a layered structure to cover at least a surface of an insulating film of the layered structure to thereby form a coating on the surface of the insulating film, in which the layered structure contains the insulating film exposed an outer surface, and a patterned metal wiring exposed to an outer surface.

<Surface Coating Material>

The surface coating material contains at least a water-soluble resin, an organic solvent, and water, preferably further contains a crosslinking agent, an antioxidant, and a surfactant, and may further contain other substances, if necessary.

—Water-Soluble Resin—

The water-soluble resin is appropriately selected depending on the intended purpose without any restriction. Examples thereof include polyvinyl alcohol, polyvinyl acetal, polyvinyl acetate, a carboxyl group-containing resin, polyvinyl pyrrolidone, polyethylene imine, polyethylene oxide, a styrene-maleic acid copolymer, polyvinyl amine, polyallyl amine, an oxazoline group-containing water-soluble resin, a phenolic hydroxyl group-containing resin, a water-soluble melamine resin, a water-soluble urea resin, an alkyd resin, a sulfone amide resin, cellulose, tannin, and resins containing any of the preceding resins at least in part thereof. These may be used independently or in combination.

Examples of the carboxyl group-containing resin include polyacrylic acid.

Examples of the phenolic hydroxyl group-containing resin include polyhydroxy styrene.

Among them, polyvinyl alcohol, polyvinyl acetal, polyvinyl acetate, polyvinyl pyrrolidone, polyethylene oxide, the phenolic hydroxyl group-containing resin, and the carboxyl group-containing resin are preferable in view of their stability.

The water solubility of the water-soluble resin is appropriately adjusted depending on the intended purpose. For example, such the water solubility is preferable that 0.1 g or more of the water-soluble resin is dissolved in 100 g of water at 25° C.

An amount of the water-soluble resin contained in the surface coating material is appropriately selected depending on the intended purpose without any restriction, and the amount thereof is preferably 0.1 parts by mass to 50 parts by mass, more preferably 0.2 parts by mass to 30 parts by mass relative to 100 parts by mass of the surface coating material. When the amount of the water-soluble resin is smaller than 0.1 parts by mass, the formed coating may not have a sufficient thickness, which may cause many foreign substances residues formed by the grown plating on an insulating film after plating. When the amount of the water-soluble resin is larger than 50 parts by mass, it may be difficult to form a uniform coating. When the amount of the water-soluble resin is within the aforementioned more preferable range, it is advantageous because abnormal growth of the plating on the insulating film can be prevented after plating.

—Organic Solvent—

The organic solvent makes the insulating film swollen when the surface coating material is applied onto the insulating film, which helps an interaction (mixing) between the surface coating material and the insulating film to proceed easily.

The organic solvent is appropriately selected depending on the intended purpose without any restriction, provided that it can swells the insulating film. Examples of the organic solvent include an alcohol organic solvent, a chain ester organic solvent, a cyclic ester organic solvent, a ketone organic solvent, a chain ether organic solvent, a cyclic ether organic solvent, and an amine organic solvent.

Examples of the alcohol organic solvent include methanol, ethanol, propyl alcohol, isopropyl alcohol, and butyl alcohol.

Examples of the chain ester organic solvent include ethyl lactate, and propylene glycol methyl ether acetate (PGMEA).

Examples of the cyclic ester organic solvent include a lactone organic solvent such as γ-butyrolactone.

Examples of the ketone organic solvent include a ketone organic solvent such as acetone, cyclohexanone, and heptanone.

Examples of the chain ether organic solvent include ethylene glycol dimethyl ether.

Examples of the cyclic ether organic solvent include tetrahydrofuran, and dioxane.

Examples of the amine organic solvent include N-methyl-2-pyrrolidone (NMP), dimethylformamide (DMF), and N,N-dimethylacetoamide (DMAC). Other examples of the amine organic solvent include amino alcohol such as monoethanol amine, diethanol amine, and triethanol amine.

An amount of the organic solvent contained in the surface coating material is appropriately adjusted depending on the intended purpose without any restriction, but it is preferably 0.1 parts by mass to 30 parts by mass relative to 100 parts by mass of the surface coating material. When the amount of the organic solvent is within the aforementioned preferable range, it is advantageous because abnormal growth of the plating on the insulating film can be prevented after plating.

—Water—

The water is appropriately selected depending on the intended purpose without any restriction, but it is preferably pure water (deionized water).

An amount of the water in the surface coating material is appropriately determined depending on the intended purpose without any restriction, but it is preferably 80 parts by mass or larger relative to 100 parts by mass of the surface coating material in view of a coating ability of the surface coating material.

—Crosslinking Agent—

The surface coating material preferably contains a crosslinking agent. By adding the crosslinking agent to the surface coating material, abnormal growth of the plating on the insulating film can be prevented after plating.

The crosslinking agent is appropriately selected depending on the intended purpose without any restriction, but is preferably a melamine derivative, a urea derivative, and an uril derivative.

Examples of the melamine derivative include alkoxymethyl melamine and derivatives thereof.

Examples of the urea derivative include urea, alkoxymethylene urea, N-alkoxymethylene urea, methylene urea, methylene urea carbonate, and derivatives thereof.

Examples of the uril derivative include benzoguanamine, glycol uril, and derivatives thereof.

These may be used independently or in combination.

An amount of the crosslinking agent contained in the surface coating material is appropriately adjusted depending on the intended purpose without any restriction, but it is preferably 0.1 parts by mass to 20 parts by mass relative to 100 parts by mass of the surface coating material. When the amount of the crosslinking agent is smaller than 0.1 parts by mass, abnormal growth of the plating on the insulating film may not be sufficiently prevented after plating. When the amount of the crosslinking agent is within the aforementioned preferable range, it is advantageous because abnormal growth of the plating on the insulating film can be desirably prevented after plating.

—Antioxidant—

The surface coating material preferably contains an antioxidant. By adding the antioxidant to the surface coating material, oxidation of the metal wirings caused during formation of a coating can be prevented.

The antioxidant is appropriately selected depending on the intended purpose without any restriction, provided that it can prevent oxidation of the metal wirings, and it is preferably carboxylic acid, or saccharides.

The carboxylic acid is appropriately selected depending on the intended purpose without any restriction, provided that it is an organic acid containing at least one carboxyl group, but it is preferably C1-C6 carboxylic acid. As for the C1-C6 carboxylic acid, oxalic acid, and formic acid are preferable.

Examples of the saccharides include monosaccharide, disaccharide, and polysaccharide. Examples of the monosaccharide include glucose, gluconolactone, glucopyranose, and fructose. Examples of the disaccharide include sucrose, lactose, and maltose. Examples of the polysaccharide include alginic acid, cellulose, starch, and glycogen. Among them, the monosaccharide is preferable, and the glucose is more preferable.

As for the antioxidant, these compounds may be used independently or in combination.

An amount of the antioxidant contained in the surface coating material is appropriately adjusted depending on the intended purpose without any restriction, but it is preferably 0.1 parts by mass to 40 parts by mass, more preferably 1.0 part by mass to 20 parts by mass relative to 100 parts by mass of the surface coating material. When the amount of the antioxidant is smaller than 0.1 parts by mass, the antioxidant does not sufficiently spread over the processing surface, which may lead to an insufficient antioxidant effect on the metal wirings. When the amount of the antioxidant is larger than 40 parts by mass, a uniform coating cannot be formed, which may cause a slight generation of foreign substances residues of the grown plating on the insulating film after plating.

—Surfactant—

The surfactant is appropriately selected depending on the intended purpose without any restriction, and examples thereof include a nonionic surfactant, a cationic surfactant, an anionic surfactant, and an amphoteric surfactant. These may be used independently, or in combination. Among them, the nonionic surfactant is preferable because it does not contain a metal ion such as a sodium salt, and potassium salt.

The nonionic surfactant is appropriately selected depending on the intended purpose without any restriction. Examples of thereof include an alkoxylate-based surfactant, a fatty acid ester-based surfactant, an amide-based surfactant, an alcohol-based surfactant, and an ethylene diamine-based surfactant. Specific examples of the nonionic surfactant include a polyoxyethylene-polyoxypropylene condensate compound, a polyoxyalkylene alkyl ether compound, a polyoxyethylene alkyl ether compound, a polyoxyethylene derivative compound, a sorbitan fatty acid ester compound, a glycerin fatty acid ester compound, a primary alcohol ethoxylate compound, a phenol ethoxylate compound, a nonylphenol ethoxylate-based compound, an octylphenol ethoxylate-based compound, a lauryl alcohol ethoxylate-based compound, an oleyl alcohol ethoxylate-based compound, a fatty acid ester-based compound, an amide-based compound, a natural alcohol-based compound, an ethylene diamine-based compound, and a secondary alcohol ethoxylate-based compound.

The cationic surfactant is appropriately selected depending on the intended purpose without any restriction, and examples thereof include an alkyl cation-based surfactant, an amide quaternary cation-based surfactant, and an ester quaternary cation-based surfactant.

The amphoteric surfactant is appropriately selected depending on the intended purpose without any restriction, and examples thereof include an amine oxide-based surfactant, and a betaine-based surfactant.

An amount of the surfactant contained in the surface coating material is appropriately adjusted depending on the intended purpose without any restriction, but it is preferably 500 ppm or less (0.05 parts by mass or smaller relative to 100 parts by mass of the surface coating material) relative to the surface coating material based on the mass ratio. The lower limit of the amount of the surfactant is appropriately adjusted depending on the intended purpose without any restriction, but it is preferably 1 ppm or more relative to the surface coating material based on the mass ratio. When the amount of the surfactant is higher than 500 ppm, the surface coating material penetrates into the interface between the metal wiring and the insulating film, which may cause problems such as an adhesion failure. When the amount of the surfactant is within the aforementioned preferable range, it is advantageous because the mixing between the insulating film and the surface coating material can be accelerated without causing an adhesion failure.

—Other Substances—

Other substances are appropriately selected depending on the intended purpose without any restriction, provided that they do not adversely affect the obtainable effect of the disclosed surface coating material.

A form of the surface coating material is appropriately selected depending on the intended purpose without any restriction, and examples thereof include an aqueous solution, a colloid solution, and an emulsion. Among them, the aqueous solution is preferable in view of a coating ability of the surface coating material.

<Layered Structure>

The layered structure is appropriately selected depending on the intended purpose without any restriction, provided that it is a layered structure containing an insulating film exposed to a surface of the layered structure and a patterned metal wiring exposed to the surface of the layered structure. Examples of the layered structure include a layered structure containing a base, an insulating film exposed to a surface of the layered structure, and a patterned metal wiring exposed to a surface of the layered structure, and optionally containing other members.

—Base—

The base is appropriately selected depending on the intended purpose without any restriction, and examples thereof include a silicon wafer, a metal oxide film, an insulating resin substrate, and a ceramic substrate.

The insulating resin substrate is appropriately selected depending on the intended purpose without any restriction, and examples thereof include a glass epoxy substrate, a polyester substrate, a polyimide substrate, a bismaleimide-triazin resin substrate, a thermoset polyphenylene ether substrate, a fluororesin substrate, a copper clad laminate, and a resin coated copper foil (RCC) substrate.

—Insulating Film—

The insulating film is appropriately selected depending on the intended purpose without any restriction, and examples thereof include an insulating film formed of an organic insulating material.

The insulating film may be a continuous film, or a patterned insulating film.

—Organic Insulating Material—

Materials used for the organic insulating material are appropriately selected depending on the intended purpose without any restriction, and examples thereof include a polyimide resin, a polyallyl ether resin, a polybenzoxazole resin, an epoxy resin, a phenol resin, and a benzocyclobutene resin.

A forming method of the insulating film is appropriately selected depending on the intended purpose without any restriction, and examples thereof include roller coating, bar coating, dip coating, gravure coating, curtain coating, die coating, spray coating, doctor coating, and spin coating.

A thickness of the insulating film is appropriately determined depending on the intended purpose without any restriction.

—Metal Wiring—

The metal wiring is appropriately selected depending on the intended purpose without any restriction, provided that it is a patterned metal wiring. The metal wiring is preferably a copper wiring.

A method for patterning the metal wiring is appropriately selected depending on the intended purpose without any restriction. For example, a conventional patterning method using a resist pattern can be used.

A width, thickness, and pitch (space) between lines of the metal wiring are appropriately selected depending on the intended purpose without any restriction.

A structure of the layered structure is appropriately selected depending on the intended purpose without any restriction. Examples thereof include a structure where the insulating film is formed on the base, and the patterned metal wiring is formed on the insulating film, and a structure where the patterned metal wiring and the insulating film provided between the metal wiring are formed on the base.

<Coating>

A coating can be formed on the surface of the insulating film by performing coating. The coating is preferably a coating (a mixing film) formed by interaction between the insulating film and the surface coating material.

When the coating is formed on the surface of the insulating film by the coating, conductive impurities present on the insulating film are covered with the coating. Specifically, the conductive impurities present on the insulating film are present in the coating. As a result, abnormal growth on the insulating film due to the presence of the conductive impurities can be prevented during electroless plating for forming a barrier layer on the metal wiring, which prevents occurrences of short circuit.

Note that, it is assumed that the conductive impurities are generated during etching and chemical mechanical polishing (CMP) for forming the metal wiring.

The coating method is appropriately selected from conventional methods known in the art depending on the intended purpose without any restriction, provided that it is a method for applying the surface coating material so as to cover at least the surface of the insulating film of the base. Examples thereof include roller coating, bar coating, dip coating, gravure coating, curtain coating, die coating, spray coating, doctor coating, and spin coating. One of these methods may be used, or two or more of them may be used in combination for coating.

—Heating—

Heating is preferably performed after the coating.

A method for heating is appropriately selected depending on the intended purpose without any restriction.

The temperature and duration for the heating are appropriately adjusted depending on the intended purpose without any restriction.

By performing the heating, mixing is accelerated.

—Water Washing—

Washing with water is preferably performed after the coating. Preferably, the washing with water is performed after the heating.

By performing the washing with water, among the coated surface coating material, a portion where no interaction (mixing) occurred with the insulating film and/or a portion where the interaction (mixing) with the insulating film is weak are dissolved and removed. In addition, the surface coating material applied on the metal wiring during the coating can also be dissolved and removed.

A method for washing with water is appropriately selected depending on the intended purpose without any restriction, but it is preferred that the washing be performed with pure water.

The metal wiring of the base to which the surface coating method has been applied is preferably further subjected to electroless plating. By performing the electroless plating, a barrier layer is formed on the metal wiring so that migration of metal ions from the metal wiring can be prevented.

One example of the surface coating method will be explained with reference to FIGS. 1A to 1D.

Figure 1B:
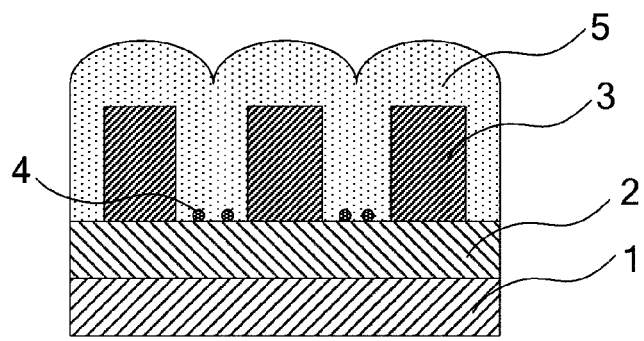
FIG. 1B is a schematic cross-sectional diagram illustrating the state where a surface coating material is applied.
Figure 1C:
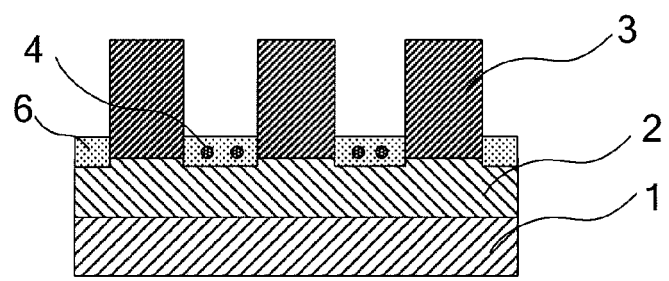
FIG. 1C is a schematic cross-sectional diagram illustrating the state where the insulating film and the surface coating material are interacted to each other (mixed) to form a coating (a mixing film).
Figure 1D:
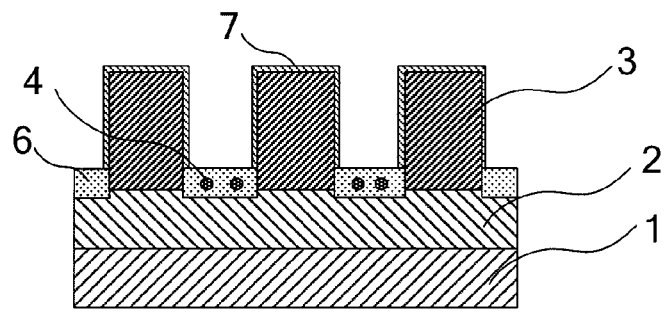
FIG. 1D is a schematic cross-sectional diagram illustrating the state where the electroless plating is performed on a surface of the metal wiring.

FIG. 1A is a schematic cross-sectional diagram illustrating a state where an insulating film 2 and a metal wiring 3 are formed on a base 1. As illustrated in FIG. 1A, conductive impurities 4 are present on the insulating film 2. These conductive impurities 4 are generally generated when the metal wiring 3 is formed. Subsequently, a surface coating material 5 is applied to a surface of the insulating film 2 as illustrated in FIG. 1B. Then, the surface coating material 5 and the insulating film 2 are heated to induce interaction (mixing) between the insulating film 2 and the surface coating material 5 to form a coating (a mixing film) 6 as illustrated in FIG. 1C. By washing with water, portions of the surface coating material 5 not interacted with the insulating film 2 are dissolved and removed. Subsequently, electroless plating is performed to form a plating layer 7 on the surface of the metal wiring 3 as illustrated in FIG. 1D.

(Semiconductor Device and Circuit Board Package)

The disclosed semiconductor device contains a layered structure containing at least an insulating film and a patterned metal wiring, a coating, and a plating layer, and may further contain other members, if necessary.

The disclosed circuit board package contains a layered structure containing at least an insulating film and a patterned metal wiring, a coating, and a plating layer, and may further contain other members, if necessary.

The coating is a coating formed on a surface of the insulating film by the disclosed surface coating method.

The plating layer is a plating layer formed on the surface of the metal wiring.

<Layered Structure>

The layered structure is appropriately selected depending on the intended purpose without any restriction, provided that it is a layered structure containing an insulating film and a patterned metal wiring. Examples thereof include a layered structure containing at least a base, an insulating film, and a patterned metal wiring, optionally further containing other members.

—Base—

The base of the semiconductor device is appropriately selected depending on the intended purpose without any restriction, and examples thereof include a silicon wafer, and a metal oxide film.

The base of circuit board package is appropriately selected depending on the intended purpose without any restriction, and examples thereof include an insulating resin substrate, and a ceramic substrate.

The insulating resin substrate is appropriately selected depending on the intended purpose without any restriction, and examples thereof include a glass epoxy substrate, a polyester substrate, a polyimide substrate, a bismaleimide-triazin resin substrate, a thermoset polyphenylene ether substrate, a fluororesin substrate, a copper clad laminate, and a resin coated copper foil (RCC) substrate.

—Insulating Film—

As for the insulating film, the insulating film described in the explanations of the surface coating method is used.

—Metal Wiring—

As for the metal wiring, the metal wiring described in the explanations of the surface coating method is used.

<Production Method of Semiconductor Device and Production Method of Circuit Board Package>

One example of the production method of the semiconductor device will be explained.

The production method of the semiconductor device contains at least forming a coating, and forming a plating layer, and may further contain other steps.

One example of the production method of the circuit board package will be explained.

The production method of the circuit board package contains at least forming a coating, and forming a plating layer, and may further contain other steps.

—Step for Forming Coating—

The forming a coating is appropriately selected depending on the intended purpose without any restriction, provided that it is a step for forming a coating at least on a surface of the insulating film by the disclosed surface coating method.

—Step for Forming Plating Layer—

The forming a plating layer is appropriately selected depending on the intended purpose without any restriction, provided that it is performed after the forming a coating, and is a step for forming a plating layer on a surface of the patterned metal wiring exposed to the surface of the layered structure by electroless plating.

—Electroless Plating—

The electroless plating is appropriately selected depending on the intended purpose without any restriction, examples thereof include electroless copper plating, electroless nickel plating, electroless nickel-phosphorus plating, electroless gold plating, electroless silver plating, and electroless tin plating.

A method of the electroless plating is appropriately selected depending on the intended purpose without any restriction.

—Other Steps—

Other steps are appropriately selected depending on the intended purpose without any restriction, and examples thereof include a step for patterning the metal wiring, and a step for forming an insulating film.

—Step for Patterning Metal Wiring—

The step for patterning the metal wiring is appropriately selected depending on the intended purpose without any restriction, and examples thereof include a step containing a combination of a step for forming a resist pattern, and a patterning step.

—Step for Forming Resist Pattern—

The step for forming a resist pattern is appropriately selected depending on the intended purpose without any restriction, and examples thereof include a step for forming a resist pattern with a conventional resist material known in the art.

The resist material is appropriately selected depending on the intended purpose without any restriction, and it may be any of negative or positive. Examples thereof include resists that can be patterned by g-line, i-line, KrF excimer laser light, ArF excimer laser light, $F_2$ excimer laser light, an electron beam and the like, such as a g-line resist, an i-line resist, a KrF resist, an ArF resist, a $F_2$ resist, an electron beam resist, and the like. These may be of chemically amplified, or of non-chemically amplified. Among them, a KrF resist, an ArF resist, a resist containing an acrylic resin are preferable. In view of the formation of finer patterns, and improvement of through-put, the ArF resist, the resolution limit of which have been desired to extend urgently, and the resist containing an acrylic resin are more preferable.

Specific examples of the resist material include a novolak-based resist, a PHS-based resist, an acryl-based resist, a cycloolefin-maleic acid anhydride (COMA)-based resist, a cycloolefin-based resist, and a hybrid (alicyclic acryl-COMA copolymer) resist. These may be modified with fluorine.

A size, and thickness of the resist pattern are appropriately adjusted depending on the intended purpose without any restriction. Especially, the thickness of the resist pattern can be appropriately determined depending on a processing surface that is a target of the process, and etching conditions, but the thickness thereof is typically approximately 100 nm to approximately 500 nm.

—Patterning Step—

The patterning step is a step for forming a patterned metal wiring by etching or plating using the resist pattern formed in the step for forming a resist pattern as a mask (as a mask pattern, etc.).

When the etching is performed, a surface on which the resist pattern has been formed is, for example, a metal film. By performing the etching, the metal film is etched and patterned with the resist pattern as a mask.

The plating is performed in specs formed between the resist pattern.

—Step for Forming Insulating Film—

The step for forming an insulating film is appropriately selected depending on the intended purpose without any restriction.

In the production methods of the semiconductor device and circuit board package, by repeating a series of the step for patterning the metal wiring, the step for forming an insulating film, the step for forming a coating, and the step for forming a plating layer, a semiconductor device and circuit board package in which the metal wiring and the insulating film are multiply laminated can be produced.

In the course of the productions of the semiconductor device, and circuit board package, the step for forming the plating layer is performed after the step for forming a coating so that the plating is performed after the conductive impurities present on the insulating film are covered (i.e. the conductive impurities are present in the coating). As a result, the semiconductor device and circuit board package can prevent abnormal growth of the plating on the insulating film due to the presence of the conductive impurities can be prevented during electroless plating for forming a barrier layer on the metal wiring. Accordingly, a semiconductor device and circuit board both of which prevent short circuit occurred by the abnormal growth of the plating can be obtained.

Specific examples of the semiconductor device include a flash memory, DRAM, and FRAM.

Specific examples of the circuit board package include a build-up multilayer wiring board, and a multi-chip module (MCM) board.

The disclosed surface coating method can prevent abnormal growth of plating due to conductive impurities on an insulating film without damaging a wiring and an insulating film.

The disclosed semiconductor device can realize a semiconductor device which can prevent failures such as short circuit, and reduction in the reliability without giving hardly any damage to a wiring and an insulating film.

The disclosed circuit board package can realize a circuit board package which can prevent failures such as short circuit, and prevent reduction in the reliability without giving hardly any damage to a wiring and an insulating film.

EXAMPLES

The disclosed embodiments are more specifically explained through examples hereinafter, but these examples shall not be construed as limiting the scope of the present invention in any way.

Production Example 1

Production of Cu Wiring 1

Figure 2A:
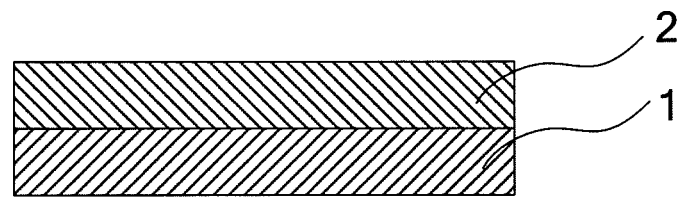
FIG. 2A is a schematic cross-sectional diagram illustrating a base on which an insulating film has been formed.
Figure 2B:
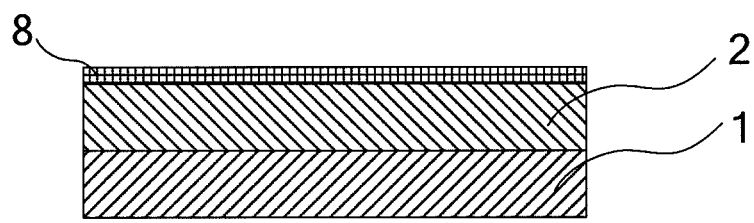
FIG. 2B is a schematic cross-sectional diagram illustrating the state where a seed layer is formed on the insulating film.
Figure 2C:
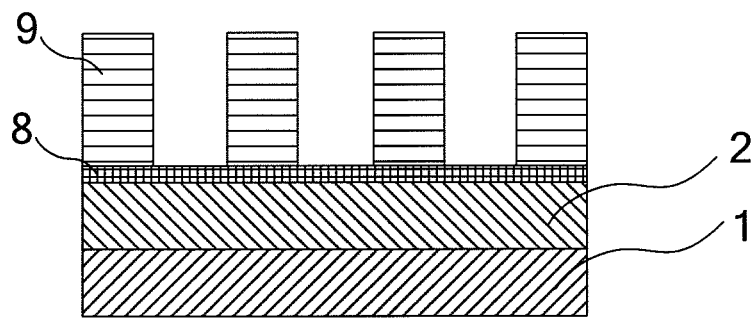
FIG. 2C is a schematic cross-sectional diagram illustrating the state where a resist film is formed on the seed layer.
Figure 2D:
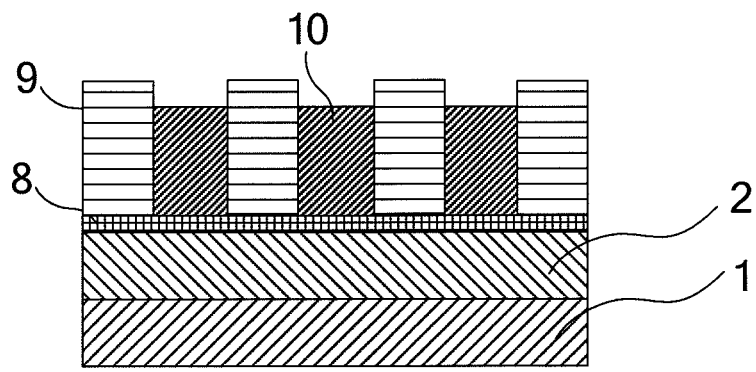
FIG. 2D is a schematic cross-sectional diagram illustrating the state where Cu wirings are formed between a pattern of the resist film.
Figure 2E:
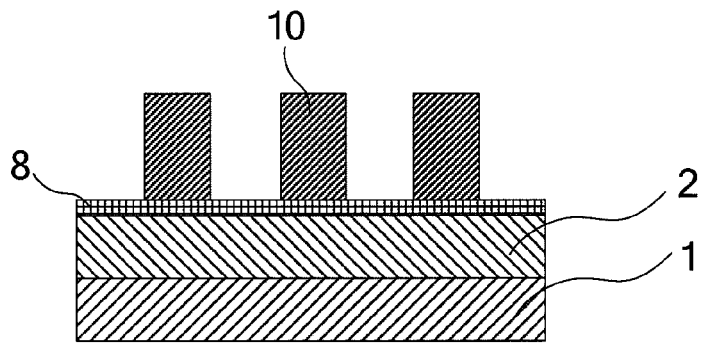
FIG. 2E is a schematic cross-sectional diagram illustrating the state where the resist film is removed.
Figure 2F:
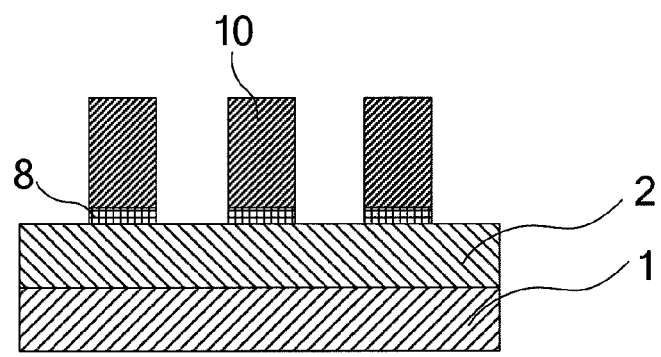
FIG. 2F is a schematic cross-sectional diagram illustrating the base on which the insulating film and the Cu wiring have been formed.

A base 1 on which an insulating film 2 and a patterned Cu wiring 10 were formed as illustrated in FIG. 2F was produced. The production method is described below. At first, a polyimide precursor solution (PIX-3400, manufactured by Hitachi Chemical Co., Ltd.) was applied on to the base 1 by spin coating, and the coated solution was prebaked at 125° C. for 2 minutes, followed by heated at 350° C. for 1 hour to thereby prepare the base 1 on which a 5 μm-thick insulating film 2 formed of polyimide was formed as illustrated in FIG. 2A. Subsequently, as illustrated in FIG. 2B, a 100 nm-thick seed layer 8 formed of Cu was formed on the insulating film 2 by sputtering. Then, as illustrated in FIG. 2C, a patterned resist film 9 (thickness: 10 μm, L/S having a half pitch of 5 μm) was formed on the seed layer 8 by a conventional resist pattern forming method using a positive novolak resist. Subsequently, a Cu wiring 10 having a thickness of 8 μm was formed in a space between the patterns of the resist film 9 by electro plating, as illustrated in FIG. 2D. Thereafter, the resist film 9 was removed by immersing in N-methyl-2-pyrrolidone (NMP) of 70° C. for 10 minutes, as illustrated in FIG. 2E. Then, as illustrated in FIG. 2F, the resultant was immersed in an aqueous solution containing hydrogen sulfate at room temperature to etch the seed layer 8, to thereby produce the base 1 on which the insulating film 2 and the patterned Cu wiring 10 were formed as illustrated in FIG. 2F.

Production Example 2

Production of Cu Wiring 2

Figure 3A:
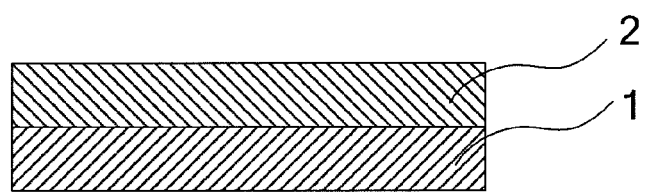
FIG. 3A is a schematic cross-sectional diagram illustrating a base on which an insulating film has been formed.
Figure 3B:
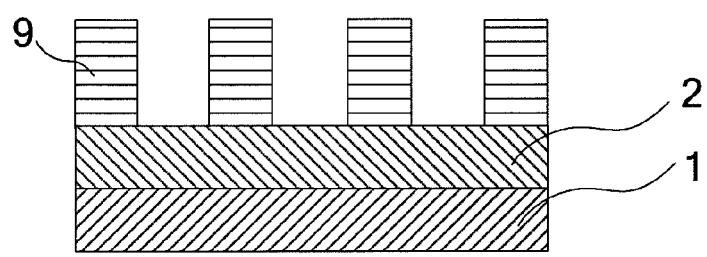
FIG. 3B is a schematic cross-sectional diagram illustrating the state where a resist film is formed on the insulating film.
Figure 3C:
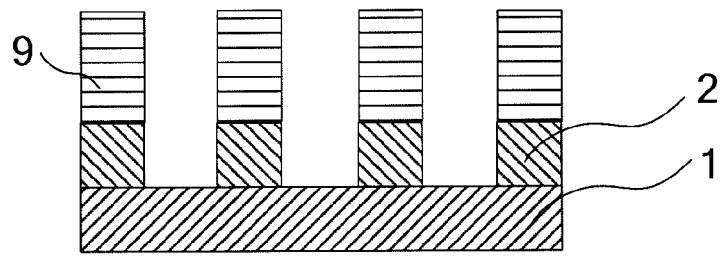
FIG. 3C is a schematic cross-sectional diagram illustrating the state where the insulating film is patterned.
Figure 3D:
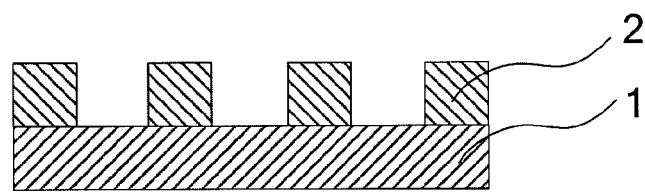
FIG. 3D is a schematic cross-sectional diagram illustrating the state where the resist film is removed.
Figure 3E:
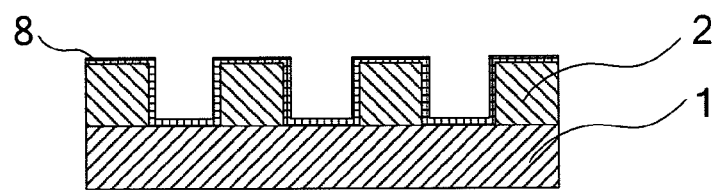
FIG. 3E is a schematic cross-sectional diagram illustrating the state where a seed layer is formed on the insulating film.
Figure 3F:
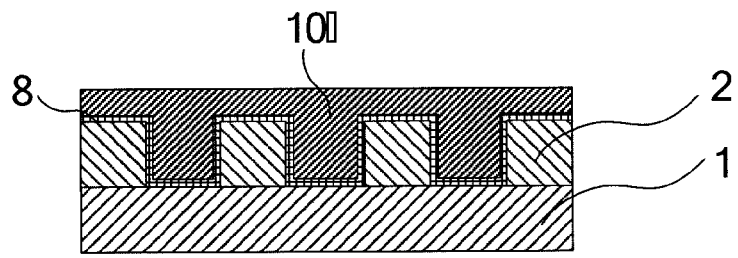
FIG. 3F is a schematic cross-sectional diagram illustrating the state where a Cu film is formed on the seed layer.
Figure 3G:
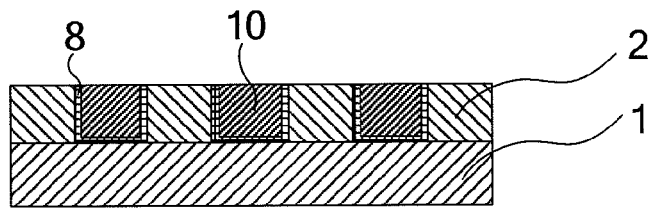
FIG. 3G is a schematic cross-sectional diagram illustrating the base on which the insulating film and the Cu wiring have been formed.

A base 1 on which a patterned insulating film 2 and a patterned Cu wiring 10 were formed as illustrated in FIG. 3G was produced. The production method is described below. At first, an organic insulating film forming material (ACCU-GLASS 512B, manufactured by Honeywell Japan Inc.) was applied onto the base 1 by spin coating. The applied material was prebaked at 100° C. for 1 minute, followed by heated at 300° C. for 1 hour, to thereby prepare the base 1 on which a 0.5 μm-thick insulating film 2 formed of polysiloxane was formed as illustrated in FIG. 3A. Subsequently, in accordance with a conventional resist pattern forming method using a positive chemically amplified resist, a patterned resist film 9 (thickness: 0.8 μm, L/S having a half pitch of 0.4 μm) was formed on the insulating film 2 as illustrated in FIG. 3B. Using the resist film 9 as a mask, dry etching was performed using $CF_4$ gas, to thereby form the patterned insulating film 2 as illustrated in FIG. 3C. Then, the resist film 9 was removed by immersing in N-methyl-2-pyrrolidone (NMP) of 70° C. for 10 minutes, as illustrated in FIG. 3D. As illustrated in FIG. 3E, a 100 nm-thick seed layer 8 formed of Cu was formed on the insulating film 2 by sputtering. As illustrated in FIG. 3F, a Cu film 10a was then formed on the seed layer 8 by electroplating. Subsequently, the Cu film 10a and the seed layer 8 on the insulating film 2 were removed by chemical mechanical polishing (CMP), to thereby produce the base 1 on which the patterned insulating film 2 and the patterned Cu wiring 10 having a thickness of 0.45 μm, as illustrated in FIG. 3G.

Preparation Example

Preparation of Surface Coating Materials and Comparative Materials

The surface coating materials A to Z and comparative materials a to b each having the respective formulation presented in Table 1 were prepared.

In Table 1, "PVA/30% acetalized" denotes polyvinyl acetal (S-LEC K, manufactured by Sekisui Chemical Co., Ltd.), "PVA" denotes polyvinyl alcohol (PVA-205C, manufactured by Kuraray Co., Ltd.), "PVP" denotes polyvinyl pyrrolidone (manufactured by Kuraray Co., Ltd.), "PHS" denotes polyhydroxystyrene (VP Polymer, manufactured by Nippon Soda Co., Ltd.), "uril" denotes tetramethoxymethyl glycol uril (manufactured by Tokyo Chemical Industry Co., Ltd.), "urea" denotes N,N'-dimethoxymethyldimethoxyethylene urea (manufactured by Sanwa Chemical Co., Ltd.), "melamine" denotes hexamethoxymethyl melamine (manufactured by Tokyo Chemical Industry Co., Ltd.), "NMP" denotes N-methyl-2-pyrrolidone, "γ-BL" denotes γ-butyrolactone, "TN-80" denotes a nonionic surfactant (a primary alcohol ethoxylate surfactant, manufactured by ADEKA CORPORATION), "PC-8" denotes a multinucleated phenol ethoxylate-based surfactant (manufactured by ADEKA CORPORATION), and "water" denotes pure water. Note that, as for the oxalic acid, formic acid and glucose, materials obtained from Kanto Chemical Co., Inc. were used.

TABLE 1

| Material | Water-soluble resin | Crosslinking agent | Water | Organic solvent | Antioxidant | Surfactant |
|---|---|---|---|---|---|---|
| a | PVA/30% acetalized (8) | — | water (92) | — | — | — |
| b | PVA/30% acetalized (8) | uril (1.0) | water (91) | — | — | — |
| A | PVA/30% acetalized (8) | — | water (83) | ethyl acetate (9) | — | — |
| B | PVA/30% acetalized (8) | uril (1.0) | water (82) | ethyl acetate (9) | — | — |
| C | PVA/30% acetalized (0.1) | uril (1.0) | water (89.9) | ethyl acetate (9) | — | — |
| D | PVA/30% acetalized (0.2) | uril (1.0) | water (89.8) | ethyl acetate (9) | — | — |
| E | PVA/30% acetalized (30) | uril (1.0) | water (60) | ethyl acetate (9) | — | — |
| F | PVA/30% acetalized (50) | uril (1.0) | water (40) | ethyl acetate (9) | — | — |
| G | PVA/30% acetalized (8) | uril (0.1) | water (82.9) | ethyl acetate (9) | — | — |
| H | PVA/30% acetalized (8) | uril (20) | water (63) | ethyl acetate (9) | — | — |
| I | PVA/30% acetalized (8) | uril (1.0) | water (90.9) | ethyl acetate (0.1) | — | — |
| J | PVA/30% acetalized (8) | uril (1.0) | water (61) | ethyl acetate (30) | — | — |
| K | PVA/30% acetalized (8) | urea (1.0) | water (82) | ethyl acetate (9) | — | — |
| L | PVA/30% acetalized (8) | melamine (0.5) | water (82.5) | ethyl acetate (9) | — | — |
| M | PVA/30% acetalized (8) | uril (1.0) | water (82) | NMP (9) | — | — |
| N | PVA/30% acetalized (8) | uril (1.0) | water (82) | γ-BL (9) | — | — |
| O | PVA (8) | uril (1.0) | water (82) | ethyl acetate (9) | — | — |

TABLE 1-continued

| Material | Water-soluble resin | Crosslinking agent | Water | Organic solvent | Antioxidant | Surfactant |
|---|---|---|---|---|---|---|
| P | PVA (6)/PHS (2) | uril (1.0) | water (82) | ethyl acetate (9) | — | — |
| Q | PVA (8) | uril (1.0) | water (82) | ethyl acetate (9) | — | — |
| R | PVA/30% acetalized (8) | uril (1.0) | water (81.95) | ethyl acetate (9) | — | TN-80 (0.05) |
| S | PVA/30% acetalized (8) | uril (1.0) | water (81.95) | ethyl acetate (9) | — | PC-8 (0.05) |
| T | PVA/30% acetalized (8) | uril (1.0) | water (81.9) | ethyl acetate (9) | oxalic acid (0.1) | — |
| U | PVA/30% acetalized (8) | uril (1.0) | water (72) | ethyl acetate (9) | oxalic acid (10) | — |
| V | PVA/30% acetalized (8) | uril (1.0) | water (42) | ethyl acetate (9) | oxalic acid (40) | — |
| W | PVA/30% acetalized (8) | uril (1.0) | water (72) | ethyl acetate (9) | formic acid (10) | — |
| X | PVA/30% acetalized (8) | uril (1.0) | water (72) | ethyl acetate (9) | glucose (10) | — |
| Y | PVA/30% acetalized (8) | uril (1.0) | water (81) | ethyl acetate (9) | oxalic acid (1.0) | — |
| Z | PVA/30% acetalized (8) | uril (1.0) | water (62) | ethyl acetate (9) | oxalic acid (20) | — |

In Table 1, the number presented in the brackets "( )" represents a mass (parts by mass).

Examples 1 to 26, and Comparative Examples 1 to 3

Surface Coating and Electroless Plating

The materials (surface coating materials and comparative materials) prepared in Preparation Example were each applied onto the base on which the insulating film and Cu wiring were formed, which had been produced in Production Example 1, and onto the base on which the insulating film and the Cu wiring were formed, which had been produced in Production Example 2, by spin coating at 2,100 rpm, followed by subjected to prebaking at 150° C. for 180 seconds. Subsequently, the resultant was washed with pure water for 30 seconds to thereby remove the material that was not interacted (mixed) with the insulating film. Then, a surface of the Cu wiring was processed with an electroless nickel-phosphorus plating solution at 70° C., followed by subjected to electroless nickel-phosphorus plating for a thickness of 50 nm.

After the electroless plating, the resultant was observed under a scanning electron microscope (SEM), and the number per square micrometer of foreign substances generated on the surface of the insulating film due to the abnormal growth of the plating was counted. The results are presented below.

TABLE 2

| | | Numbers of foreign substances (piece/μm²) | |
|---|---|---|---|
| | Material | Cu wiring 1 | Cu wiring 2 |
| Comparative Example 1 | — | 37 | 15 |
| Comparative Example 2 | a | 38 | 16 |
| Comparative Example 3 | b | 39 | 15 |
| Example 1 | A | 30 | 11 |
| Example 2 | B | 0 | 1 |
| Example 3 | C | 12 | — |
| Example 4 | D | 10 | — |
| Example 5 | E | 6 | — |
| Example 6 | F | 9 | — |
| Example 7 | G | 29 | — |
| Example 8 | H | 11 | — |
| Example 9 | I | 34 | — |
| Example 10 | J | 18 | — |
| Example 11 | K | 2 | 3 |
| Example 12 | L | 1 | 2 |
| Example 13 | M | 0 | 6 |
| Example 14 | N | 0 | 5 |
| Example 15 | O | 1 | 6 |
| Example 16 | P | 0 | 4 |
| Example 17 | Q | 0 | 4 |
| Example 18 | R | 0 | 2 |
| Example 19 | S | 0 | 2 |
| Example 20 | T | 0 | — |
| Example 21 | U | 0 | — |
| Example 22 | V | 2 | — |
| Example 23 | W | 0 | — |
| Example 24 | X | 0 | — |
| Example 25 | Y | 0 | — |
| Example 26 | Z | 0 | — |

In Table 2, "Cu Wiring 1" denotes the base on which Cu wiring is formed, which has been produced in Production Example 1, "Cu Wiring 2" denotes the base on which Cu wiring is formed, which has been produced in Production Example 2.

In Table 2, Comparative Example 1 depicts a result of the case where neither of the surfaces coating material nor the comparative material has been applied, and electroless nickel-phosphorus plating has been performed on the surface of the Cu wiring for a thickness of 50 nm.

In Table 2, "-" means that no test is performed.

It was found from the results presented in Table 2, Examples 1 to 26 had the lower number of the foreign substances compared to that of Comparative Example 1, in which the surface coating material had not been applied, and had desirable results. Note that, Examples 1, 7, and 9 had the low reduction in terms of the number of the foreign substances, but had sufficient effects for preventing failures such as short circuit and reduction in the reliability.

On the other hand, Comparative Examples 2 and 3 using the comparative materials had the results in each of which the number of the foreign substances hardly changed from that in Comparative Example 1. It is probably because the comparative material was not interacted (mixed) with the insulating film, and washed away, so that the surface of the insulating film was not covered.

In Examples, the more desirable results were obtained in the case where the surface coating material contained the crosslinking agent in an amount of 0.1% by mass to 20% by mass relative to the surface coating material, compared to the case where the surface coating material did not contain a crosslinking agent.

Moreover, when the amount of the water-soluble resin was 0.2% by mass to 30% by mass relative to the surface coating material, the more desirable result was obtained.

When the amount of the organic solvent was 0.1% by mass to 30% by mass relative to the surface coating material, furthermore, the more desirable result was obtained. In Example 9, a slight phase separation occurred in the surface coating material, which caused unevenness in the coating, but the number of the foreign substances was reduced, and the desirable result was obtained.

<Resistance Evaluation>

The degree of oxidization of the cupper wiring (Cu Wiring) was confirmed by measuring the ohmic values before and after surface coating. Specifically, the materials B, and T to Z of Examples 2 and 20 to 26 were used to perform surface coating on the Cu wiring 1 in the same manner as described above. Six hours after covering the surface of the Cu wiring 1, a Cu via hole having a diameter of 10 μm and height of 20 μm was formed in two places at the edge of the Cu wiring to be spaced each other by 1 cm, and the ohmic value between the Cu via holes was measured by a milliohmmeter 4338B (manufactured by Agilent Technologies). The results are presented in Table 3.

TABLE 3

|  | Material | Ohmic value (mΩ) |
|---|---|---|
| Before surface coating | — | 6.3 |
| Example 2 | B | 13.4 |
| Example 20 | T | 12.9 |
| Example 21 | U | 6.1 |
| Example 22 | V | 5.9 |
| Example 23 | W | 6.6 |
| Example 24 | X | 7.1 |
| Example 25 | Y | 9.5 |
| Example 26 | Z | 6.1 |

In the case where the surface of the Cu wiring was covered with the material B which did not contain an antioxidant, an increase in the ohmic value due to the oxidation of the Cu wiring was observed, but it was confirmed that the materials T to Z each containing the antioxidant prevented oxidation of the Cu wiring.

Example 27

Production of Semiconductor Device

Figure 4A:
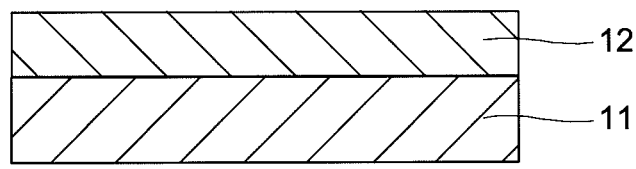
FIG. 4A is a schematic diagram for explaining one example of the production of the disclosed semiconductor device, which illustrates a state where an interlayer insulating film is formed on a silicon substrate.
Figure 4B:
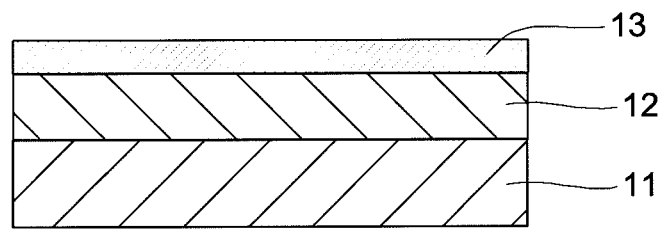
FIG. 4B is a schematic diagram for explaining one example of the production of the disclosed semiconductor device, which illustrates a state where a titanium film is formed on the interlayer insulating film depicted in FIG. 4A.
Figure 4C:
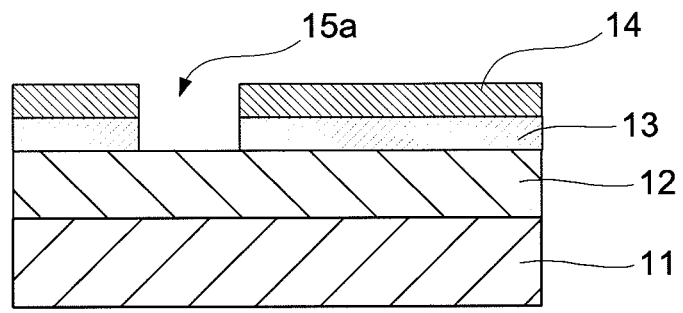
FIG. 4C is a schematic diagram for explaining one example of the production of the disclosed semiconductor device, which illustrates a state where a resist film is formed on the titanium film, and a hole pattern is formed in the titanium film.
Figure 4D:
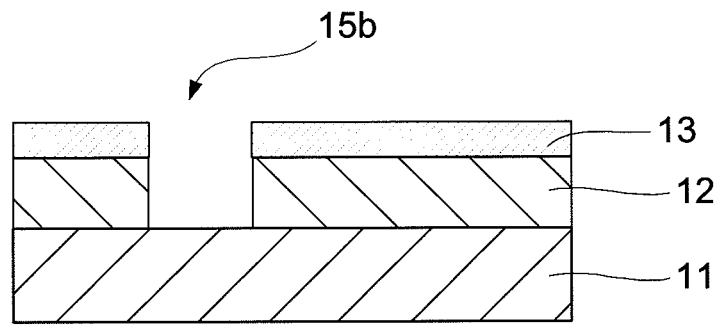
FIG. 4D is a schematic diagram for explaining one example of the production of the disclosed semiconductor device, which illustrates a state where the hole pattern is also formed in the interlayer insulating film.

As illustrated in FIG. 4A, an interlayer insulating film 12 formed of polysiloxane was formed on a silicon substrate 11, and a titanium film 13 was formed on the interlayer insulating film 12 by sputtering as illustrated in FIG. 4B. As illustrated in FIG. 4C, a resist pattern 14 was then formed by a conventional photolithographic technique, and using the resist pattern 14 as a mask, the titanium film 13 was patterned by reactive ion etching to form an opening 15a. The reactive ion etching was continued to remove the resist pattern 14, as well as forming an opening 15b in the insulating film 12 using the titanium film 13 as a mask, as illustrated in FIG. 4D.

Figure 4E:
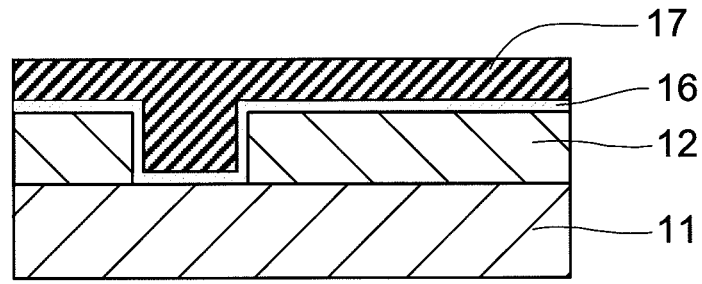
FIG. 4E is a schematic diagram for explaining one example of the production of the disclosed semiconductor device, which illustrates a state where a Cu film is formed on the interlayer insulating film in which the hole pattern has been formed.
Figure 4F:
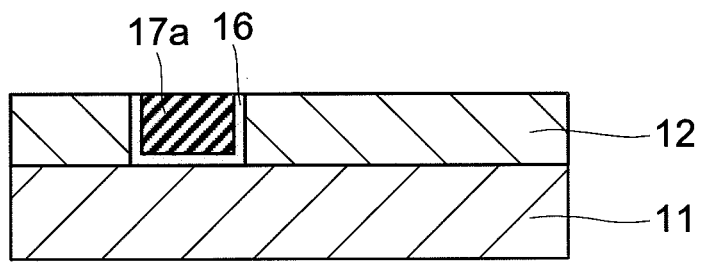
FIG. 4F is a schematic diagram for explaining one example of the production of the disclosed semiconductor device, which illustrates a state where the Cu film deposited on the interlayer insulating film other than that in the hole pattern is removed.

Next, the titanium film 13 was removed by a wet process, and a TiN film 16 was formed on the interlayer insulating film 12 was formed by sputtering as illustrated in FIG. 4E, followed by forming a Cu film 17 on the TiN film 16 by electroplating. As illustrated in FIG. 4F, the surface was leveled by CMP with leaving the barrier metal and Cu film (the first metal film) only in the groove corresponding to the opening 15b (FIG. 4D), to thereby form a first layer wiring 17a.

Figure 4G:
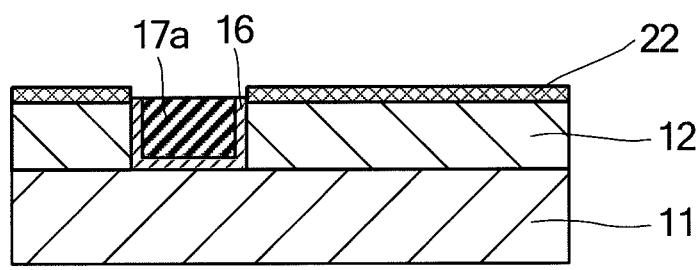
FIG. 4G is a schematic diagram for explaining one example of the production of the disclosed semiconductor device, which illustrates a state where a coating is formed on the interlayer insulating film.

Next, as illustrated in FIG. 4G, the surface coating material B prepared in Production Example was applied onto the interlayer insulating film 12, followed by heating and washing with water, to thereby cover the interlayer insulating film 12 with a coating 22.

Figure 4H:
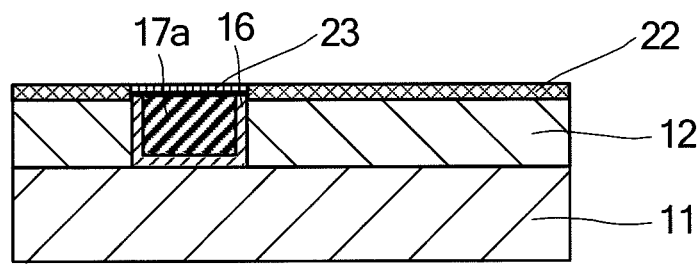
FIG. 4H is a schematic diagram for explaining one example of the production of the disclosed semiconductor device, which illustrates a state where nickel-phosphorus plating is formed on a first wiring.

As illustrated in FIG. 4H, electroless plating was then performed to thereby form a nickel-phosphorus film 23 on the first layer wiring 17a.

Figure 4I:
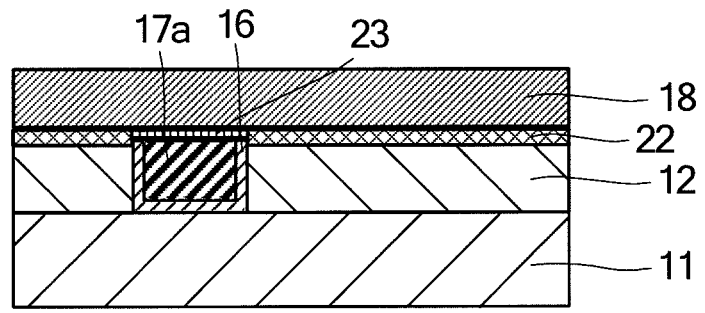
FIG. 4I is a schematic diagram for explaining one example of the production of the disclosed semiconductor device, which illustrates a state where an interlayer insulating film is formed on the first wiring formed in the hole pattern and the interlayer insulating film.
Figure 4J:
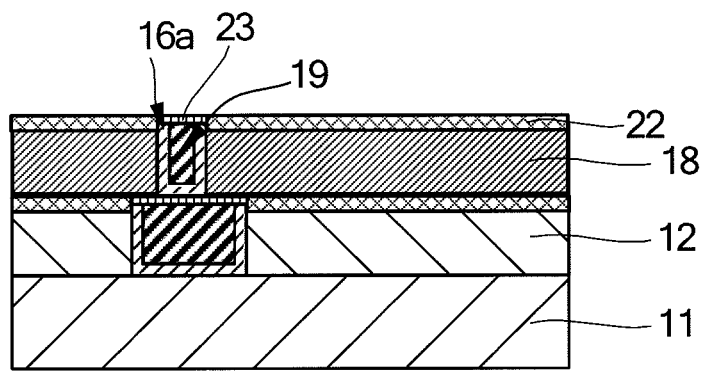
FIG. 4J is a schematic diagram for explaining one example of the production of the disclosed semiconductor device, which illustrates a state where a hole pattern is formed in the interlayer insulating film as a surface layer to form a Cu plug.

Subsequently, as illustrated in FIG. 4I, an interlayer insulating film 18 was formed on the first layer wiring 17a, followed by forming a Cu plug (a second metal film) 19 for connecting the first layer wiring 17a with the upper layer wiring to be formed later, a surface coating material 22 and a nickel-phosphorus plating film 23 as illustrated in FIG. 4J, in the same manner as in FIG. 4B to FIG. 4H.

Figure 4K:
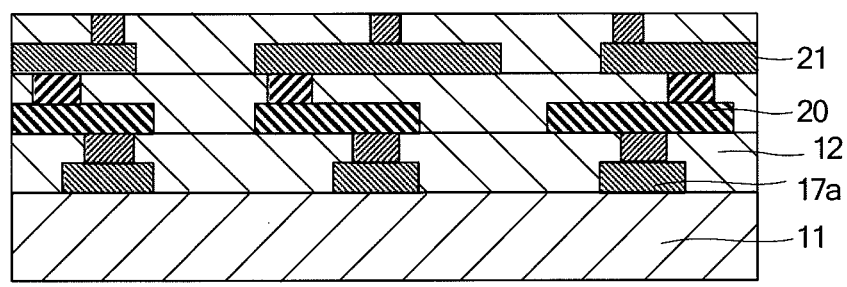
FIG. 4K is a schematic diagram for explaining one example of the production of the disclosed semiconductor device, which illustrates a state where a wiring having a three-layer structure is formed.

By repeating these operations, as illustrated in FIG. 4K, a semiconductor device having a multilayer wiring structure containing the first layer wiring 17a, the second layer wiring 20 and the third layer wiring 21 on the silicon substrate 11 was produced. Note that, in FIG. 4K, a barrier metal layer formed beneath each layer wiring, a surface coating material film, and a nickel-phosphorus film are omitted.

The interlayer insulating film 12 was a low dielectric film having dielectric constant of 2.7 or lower, which was for example a fluorocarbon film (dielectric constant 2.4) deposited by RFCVD (powder: 400 W) using a porous silica film (Cemerate NCS, manufactured by JGC Catalysts and Chemicals Ltd., dielectric constant 2.25), and a mixed gas of $C_4F_8$ and $C_2H_2$, or $C_4F_8$ gas as a source.

Example 28

Production of Circuit Board Package

Figure 5A:
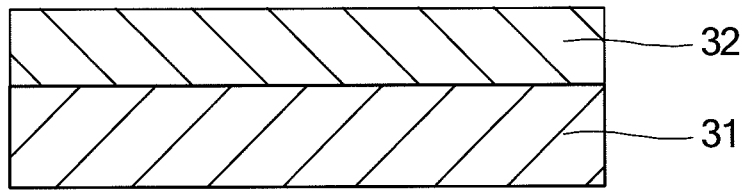
FIG. 5A is a schematic diagram for explaining one example of the production of the disclosed circuit board package, which illustrates a state where an insulating film is formed on a glass epoxy substrate.
Figure 5B:
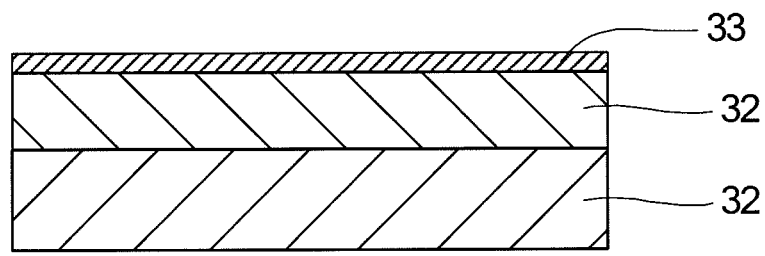
FIG. 5B is a schematic diagram for explaining one example of the production of the disclosed circuit board package, which illustrates a state where a seed layer is formed on the insulating film.
Figure 5C:
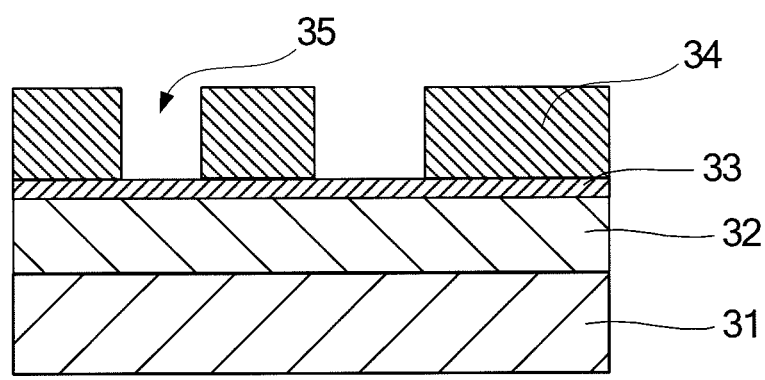
FIG. 5C is a schematic diagram for explaining one example of the production of the disclosed circuit board package, which illustrates a state where a resist pattern is formed on the seed layer.
Figure 5D:
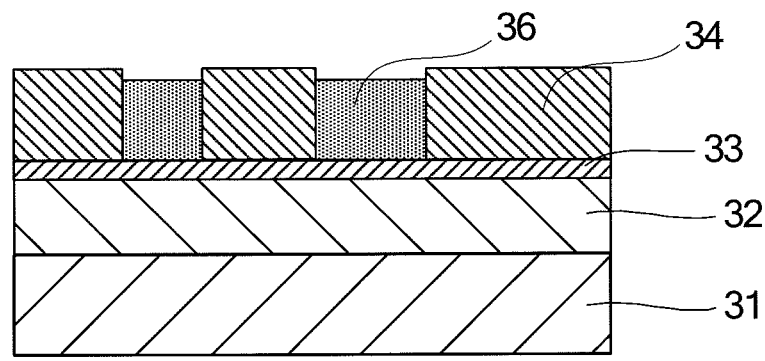
FIG. 5D is a schematic diagram for explaining one example of the production of the disclosed circuit board package, which illustrates a state where a Cu pattern is formed in the openings formed in the resist pattern.
Figure 5E:
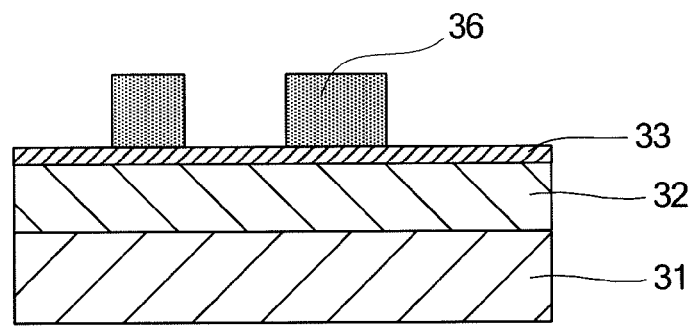
FIG. 5E is a schematic diagram for explaining one example of the production of the disclosed circuit board package, which illustrates a state where the resist pattern is removed.
Figure 5F:
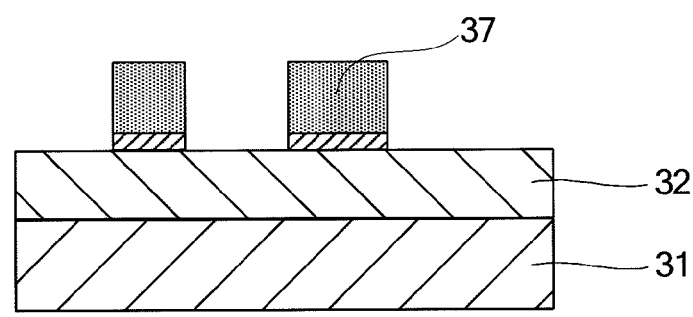
FIG. 5F is a schematic diagram for explaining one example of the production of the disclosed circuit board package, which illustrates a state where the seed layer is etched to form a Cu wiring.

As illustrated in FIG. 5A, an insulating film 32 formed of polyimide was formed on a glass epoxy substrate 31, and a seed layer 33 formed of Cu was formed on the insulating film 32 by sputtering as illustrated in FIG. 5B. Next, as illustrated in FIG. 5C, a resist pattern 34 in which an opening 35 was formed was formed by a conventional photolithographic technique. As illustrated in FIG. 5D, a Cu pattern 36 was then formed in the opening 35 by electroplating. As illustrated in FIG. 5E, the resist pattern 34 was removed, and then the seed layer 33 was etched to form a Cu wiring 37 as illustrated in FIG. 5F.

Figure 5G:
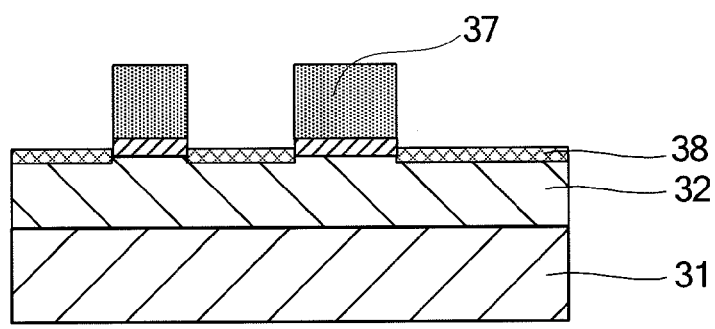
FIG. 5G is a schematic diagram for explaining one example of the production of the disclosed circuit board package, which illustrates a state where a coating is formed on the insulating film.

Subsequently, as illustrated in FIG. 5G, the surface coating material B prepared in Preparation Example was applied onto the insulating film 32, followed by heating and washing with water, to thereby cover the insulating film 32 with a coating 38.

Figure 5H:
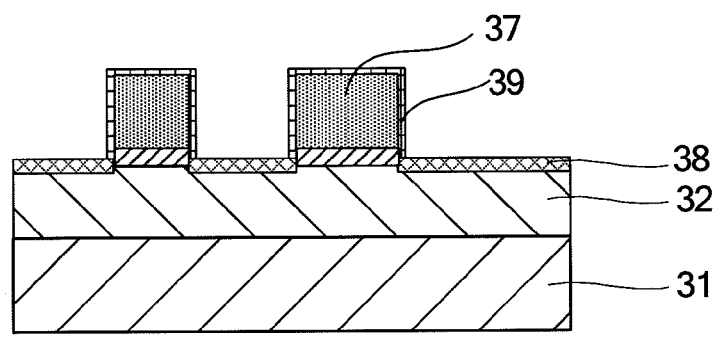
FIG. 5H is a schematic diagram for explaining one example of the production of the disclosed circuit board package, which illustrates a state where nickel-phosphorus plating is formed on the Cu wiring.

Next, as illustrated in FIG. 5H, electroless plating was performed to form a nickel-phosphorus plating film 39 was formed on the Cu wiring 37, to thereby produce a circuit board package.

Since the disclosed surface coating method can prevent abnormal growth of plating due to conductive impurities on an insulating film without damaging a wiring or an insulating film, and can prevent failures such as short circuit, and reduction in the reliability, the disclosed surface coating method can be suitably applied in production of a semiconductor device or a circuit board package.

Since the disclosed semiconductor device can prevent failures such as short circuit, and reduction in its reliability, the disclosed semiconductor device can be suitably used as various semiconductor devices, such as a flash memory, DRAM, and FRAM.

Since the disclosed circuit board package can prevent failures such as short circuit, and reduction in its reliability, the disclosed circuit board package can be suitably used as a build-up multilayer wiring board, a multi-chip module (MCM) board.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the sprit and scope of the invention.

What is claimed is:

1. A surface coating method, comprising:
   applying a surface coating material to a layered structure so as to cover at least a surface of an insulating film of the layered structure, to form a coating on the surface of the insulating film,
   wherein the surface coating material contains a water-soluble resin, an organic solvent, and water,
   wherein the layered structure contains the insulating film exposed to an outer surface, and a patterned metal wiring exposed to an outer surface, and
   wherein the insulating film is at least one of a polyimide resin film, a polyallyl ether resin film, a polybenzoxazole resin film, an epoxy resin film, a phenol resin film, and a benzocyclobutene resin film.

2. The surface coating method according to claim 1, wherein the surface coating material further contains a crosslinking agent.

3. The surface coating method according to claim 1, wherein the water-soluble resin is at least one selected from the group consisting of polyvinyl alcohol, polyvinyl acetal, polyvinyl acetate, polyvinyl pyrrolidone, polyethylene oxide, a phenolic hydroxyl group-containing resin, and a carboxyl group-containing resin.

4. The surface coating method according to claim 2, wherein the crosslinking agent is at least one selected from the group consisting of a melamine derivative, a urea derivative, and an uril derivative.

5. The surface coating method according to claim 1, wherein an amount of the water-soluble resin in the surface coating material is 0.1 parts by mass to 50 parts by mass relative to 100 parts by mass of the surface coating material.

6. The surface coating method according to claim 1, wherein the organic solvent is at least one selected from the group consisting of an alcohol-based organic solvent, a chain ester-based organic solvent, a cyclic ester-based organic solvent, a ketone-based organic solvent, a chain ether-based organic solvent, a cyclic ether-based organic solvent, and an amine-based organic solvent.

7. The surface coating method according to claim 1, wherein the surface coating material further contains an antioxidant.

8. The surface coating method according to claim 7, wherein the antioxidant is carboxylic acid, or saccharides, or a combination of carboxylic acid and saccharides.

9. The surface coating method according to claim 8, wherein the carboxylic acid is oxalic acid, or formic acid, or a combination of oxalic acid and formic acid.

10. The surface coating method according to claim 8, wherein the saccharides are glucose.

11. The surface coating method according to claim 7, wherein an amount of the antioxidant in the surface coating material is 0.1 parts by mass to 40 parts by mass relative to 100 parts by mass of the surface coating material.

12. The surface coating method according to claim 1, wherein the surface coating material further contains a surfactant.

13. A semiconductor device, comprising:
    a layered structure containing an insulating film and a patterned metal wiring;
    a coating formed on a surface of the insulating film; and
    a plating layer formed on a surface of the metal wiring,
    wherein the coating is formed by the method containing:
    applying a surface coating material to the layered structure so as to cover at least a surface of the insulating film of the layered structure, to form the coating on the surface of the insulating film,
    wherein the surface coating material contains a water-soluble resin, an organic solvent, and water,
    wherein the layered structure contains the insulating film exposed to an outer surface, and the patterned metal wiring exposed to an outer surface, and
    wherein the insulating film is at least one of a polyimide resin film, a polyallyl ether resin film, a polybenzoxazole resin film, an epoxy resin film, a phenol resin film, and a benzocyclobutene resin film.

14. A circuit board package comprising:
    a layered structure containing an insulating film and a patterned metal wiring;
    a coating formed on a surface of the insulating film; and
    a plating layer formed on a surface of the metal wiring,
    wherein the coating is formed by the method containing:
    applying a surface coating material to the layered structure so as to cover at least a surface of the insulating film of the layered structure, to form the coating on the surface of the insulating film,
    wherein the surface coating material contains a water-soluble resin, an organic solvent, and water,
    wherein the layered structure contains the insulating film exposed to an outer surface, and the patterned metal wiring exposed to an outer surface, and
    wherein the insulating film is at least one of a polyimide resin film, a polyallyl ether resin film, a polybenzoxazole resin film, an epoxy resin film, a phenol resin film, and a benzocyclobutene resin film.

* * * * *